United States Patent
Boone et al.

(10) Patent No.: US 6,836,022 B2
(45) Date of Patent: Dec. 28, 2004

(54) HIGH VOLTAGE FLIP-CHIP COMPONENT PACKAGE AND METHOD FOR FORMING THE SAME

(75) Inventors: Mark R. Boone, Gilbert, AZ (US); Andreas A. Fenner, Chandler, AZ (US); Juan G. Milla, Mesa, AZ (US); Lary R. Larson, Gold Canyon, AZ (US)

(73) Assignee: Medtronic, Inc., Minneapolis, MN (US)

( * ) Notice: Subject to any disclaimer, the term of this patent is extended or adjusted under 35 U.S.C. 154(b) by 66 days.

(21) Appl. No.: 10/365,765

(22) Filed: Feb. 13, 2003

(65) Prior Publication Data

US 2004/0159956 A1 Aug. 19, 2004

(51) Int. Cl.[7] .................. H01L 23/48; H01L 23/552
(52) U.S. Cl. .................. 257/778; 257/659; 257/738
(58) Field of Search .................. 257/127, 170, 257/340, 367, 401, 409, 484, 605, 659, 660, 687, 737, 738, 688, 777–780; 438/117

(56) References Cited

U.S. PATENT DOCUMENTS

| | | |
|---|---|---|
| 5,371,404 A | 12/1994 | Juskey et al. |
| 5,808,878 A | 9/1998 | Saito et al. |
| 6,103,551 A | 8/2000 | Ono et al. |
| 6,489,669 B2 * | 12/2002 | Shimada et al. ............ 257/686 |
| 6,521,978 B2 * | 2/2003 | Fenk et al. ................ 257/659 |
| 6,720,662 B1 * | 4/2004 | Den ......................... 257/777 |

FOREIGN PATENT DOCUMENTS

| | | |
|---|---|---|
| JP | 05259217 A | 10/1993 |
| JP | 2001053092 | 2/2001 |
| WO | WO 94/18707 | 8/1994 |
| WO | WO 01/15225 A1 | 3/2001 |

* cited by examiner

Primary Examiner—Hung Vu
(74) Attorney, Agent, or Firm—Michael C. Soldner; Girma Wolde-Michael

(57) ABSTRACT

A flip-chip package comprises a substrate having at least one layer and a component flip-chip mounted to the substrate, the component having a field termination ring. The flip-chip package further comprises a shield plane interposed between the at least one layer of substrate and the field termination ring.

18 Claims, 3 Drawing Sheets

HIGH VOLTAGE FLIP-CHIP COMPONENT PACKAGE AND METHOD FOR FORMING THE SAME

FIELD OF THE INVENTION

The present invention generally relates to die packaging, and more particularly relates to a high-voltage flip-chip component package and a high-voltage flip-chip packaging process.

BACKGROUND OF THE INVENTION

Die packaging has continued to receive a significant amount of attention from designers and manufacturers of electronic products. This attention is based upon the market demand for products with greater efficiency, higher performance, and smaller dimensions. The market demand for smaller dimensions is driven at least to some extent by portable electronic product applications, such as Implantable Medical Devices (IMDs).

As the dimensions of an IMD package become smaller and smaller, and as more and more components are added to such a device, the area that is available for additional components is reduced within the IMD package. Furthermore, as the dimensions of the components are also shrinking, it is desirable to improve the use of the dimensions within the IMD package. While die packages have been designed and manufactured that improve the utilization of all three dimensions within electronic packages, including portable electronic packages such as IMD packages, improvements are sought to the die package and the methods of forming the die package.

Flip-chip technology is a semiconductor fabrication technology that allows the overall package size to be made very compact. The flip-chip package configuration differs from the conventional ones particularly in that it mounts the die in an upside-down manner over the chip carrier, or substrate, and electrically couples the die to the substrate by means of solder bumps provided on the active surface of the die. Since minimal or no bonding wires are required, which would otherwise occupy much layout space, the overall size of the flip-chip package can be made very compact as compared to conventional types of electronic packages.

However, high voltage die used in IMD packages present challenges in flip-chip packaging. High voltage die refers to an electronic component or device that is operable with a potential greater than about 50 volts across any two electrical terminals or contacts of the component. Such high voltage components may be further operable at DC voltages greater than about 100 volts, and even further may be operable at DC voltages greater than about 500 volts, 1000 volts and even greater, perhaps as great as 1600 or more volts. High voltage die may include devices such as Field Effect Transistors (FETs), Metal Oxide Semiconductor (MOS) FETs (MOSFETs), Insulated Gate FETs (IGFETs), thyristors, bipolar transistors, diodes, MOS-controlled thyristors, resistors, capacitors, etc.

At high temperatures, such as temperatures above about 80° C., the underfill used in the flip-chip package may become polarized and/or ions in the underfill may be attracted to the high voltage die. Such phenomena may cause detrimental electrical performance changes, such as, for example, leakage current that can cause a device in the off-state to switch to the on-state.

In addition, circuit traces formed within the substrate upon which the high-voltage die is mounted create electric fields. If the circuit traces are not routed deep enough within the substrate, the electric fields may be sufficiently close to the die and of sufficient strength to negatively influence the performance of the die.

Accordingly, it is desirable to provide an improved flip-chip package and an improved flip-chip packaging process. It is further desirable to provide an improved flip-chip package for high voltage components and an improved flip-chip packaging process for packaging high voltage components. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

According to an exemplary embodiment of the invention, there is provided a flip-chip package comprising a substrate having at least one layer and a component flip-chip mounted to the substrate, the component having a field termination ring. The flip-chip package further comprises a shield plane interposed between the at least one layer of substrate and the field termination ring.

According to another exemplary embodiment of the invention, there is provided a flip-chip packaging process. The process comprises the steps of providing a substrate having at least one layer and providing a component having a field termination ring. The process further includes the steps of flip-chip mounting the component to the substrate and interposing a shield plane between the at least one layer of the substrate and the field termination ring.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Various changes to the described embodiments may be made in the function and arrangement of the elements described herein without departing from the scope of the invention. Furthermore, there is no intention to be bound by any theory presented in the preceding background of the invention or the following detailed description of the invention.

Figure 1:
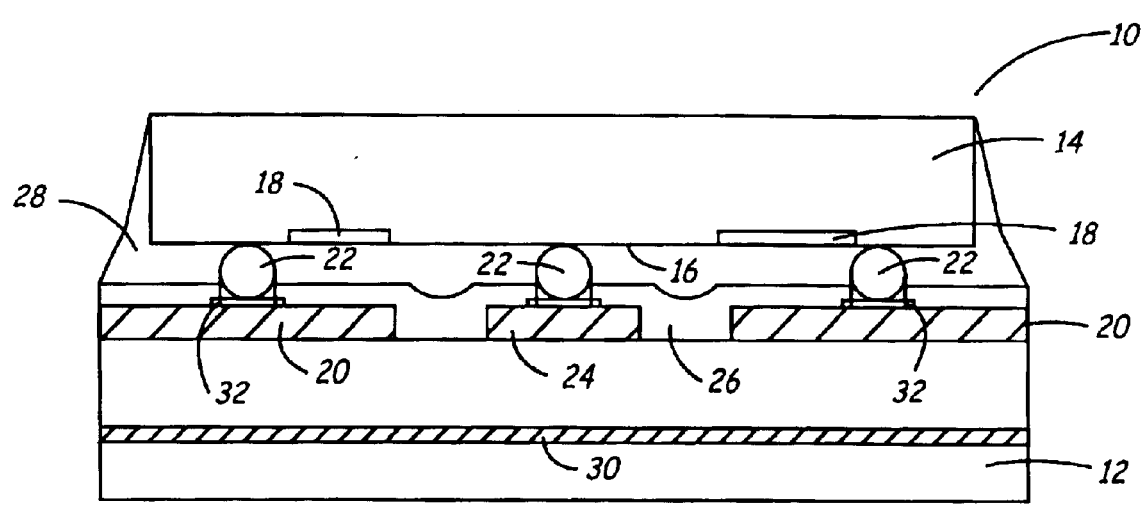
FIG. 1 is a cross-sectional view of a flip-chip package in accordance with an exemplary embodiment of the present invention.

FIG. 1 illustrates an exemplary embodiment of the flip-chip component package 10 of the present invention, which is particularly beneficial in high voltage discrete die packages and other high voltage component packages, where "high voltage component" or "high voltage discrete die" is defined herein as a device that is operable with a potential greater than fifty (50) volts, preferably greater than one hundred (100) volts, more preferably greater than five hundred (500) volts, and even more preferably greater than one thousand (1000) or sixteen hundred (1600) volts. However, one of ordinary skill in the art will recognize that other die and components can be employed in packages according to various embodiments of the present invention, which packages can be used in a wide variety of applications. The component package or high voltage component package in accordance with the present invention may include any number of devices such as Field Effect Transistors (FETs), Metal Oxide Semiconductor (MOS) FETs (MOSFETs), Insulated Gate FETs (IGFETs), thyristors, bipolar transistors, diodes, MOS-controlled thyristors, resistors, capacitors, etc.

Flip-chip component package 10 comprises a non-metal substrate 12 and a component, or die, 14. Component 14 has a first surface 16 at which has been formed at least one field termination ring 18. Field termination ring 18 may be formed on first surface 16 of component 14 using any method as is known in the semiconductor industry including but not limited to, diffusion, implantation, and the formation of moats. Typically, component 14 comprises a plurality of concentric field termination rings. Field termination rings are well known in the semiconductor industry and, accordingly, will not be described in detail here.

Flip-chip component package 10 further comprises a shield plane 20 interposed between substrate 12 and component 14. In one exemplary embodiment of the invention, shield plane 20 is formed overlying substrate 12. Shield plane 20 is formed of a conductive material, such as, for example, a metal. In a preferred embodiment, shield plane 20 is formed of copper. It will be appreciated that flip-chip component package 10 may comprise further active components or connections, such as conductive layer 24 overlying substrate 12.

Component 14 is "flip-chip mounted" onto substrate 12. As illustrated in FIG. 1, component 14 is formed with a plurality of solder bumps 22 connected to active electrical terminal connections at first surface 16. Each solder bump 22 is connected to a solder bonding pad 32 formed on substrate 12. In one exemplary embodiment, flip-chip component package 10 also may comprise a solder mask layer 26, which may overlie shield plane 20 and may be patterned to define solderable areas, such as, for example, solder bonding pads 32 to which solder bumps 22 are connected. Flip-chip component package 10 further comprises an underfill material 28. The underfill material 28 may comprise epoxy resin or any other material well known in the semiconductor industry.

Without intending to be bound by theory, it is believed that, at elevated temperatures, typically temperatures greater than about 80° C., underfill material 28 may begin to approach its glass-transition temperature. Underfill material 28 may lose hardness, and the molecules may be free to move or rotate within the material. This may allow the underfill molecules to become polarized in the presence of a strong electric field. The mobility of free ionic contaminants in underfill material 28 also may be increased as the material softens as the temperature is increased. When component 14 is in the "off-state" and a voltage is applied across main electrical terminals, an electric field may develop across field termination ring 18 on the surface 16 of component 14. An electric fringing field may extend from the surface of component 14 into underfill material 28. The polar components of underfill 28 may orient themselves as dictated by the direction and polarity of the electric fringing field. Any free ions may move through underfill material 28 as dictated by the polarity of their charge and the direction of the electric fringing field. The ions may then accumulate at the surface of component 14 if the electric fringing field is applied continuously at an elevated temperature. The additional electric field set up by polarization of underfill 28 or accumulation of ionic charge may have a negative effect on the performance of component 14. As underfill material 28 polarizes and the charge accumulates, the additional electric fields may terminate on charge carriers in component 14 and create an inversion layer at the surface of component 14 that may form a leakage path across field termination ring 18. This may cause component 14 to gradually switch from the "off-state" to the "on-state."

Shield plane 20 is configured so that there is a dominant electric field between component 14 and shield plane 20, rather than across field termination ring 18. The field between component 14 and shield plane 20 may create polarization of underfill material 28 towards shield plane 20. It also may attract ions towards shield plane 20 and away from the surface of component 14, and generate a vertical electric field that promotes a light accumulation layer to form at the surface of component 14. In this manner, the formation of the inversion layer at the surface of the substrate may be reduced or eliminated, and leakage current stability may be achieved. Accordingly, in one exemplary embodiment of the invention, shield plane 20 is configured to receive a biasing voltage to produce the electric field between component 14 and shield plane 20. The biasing voltage preferably has a magnitude at least as great as the magnitude of the biasing voltage applied to component 14, the voltages having the same polarity. For example, for a component package 10 with an N-type substrate, a positive biasing voltage is applied to shield plane 20, the positive biasing voltage preferably having a magnitude at least as great as the magnitude of the most positive biasing voltage applied to component 14. Similarly, for a component package 10 having a P-type substrate, a negative biasing voltage is applied to shield plane 20, the negative biasing voltage preferably having a magnitude at least as great as the magnitude of the most negative biasing voltage applied to component 14. Shield plane 20 may be connected directly to a terminal of the component 14 if the component has unidirectional blocking characteristics, such as MOSFETs and diodes. However, if component 14 has bidirectional blocking, such as a thyristor, the voltage on shield plane 20 should be switched. In either case, shield plane 20 should be biased with a polarity that promotes accumulation of majority carriers at the surface of the lightly doped surface region at the field termination ring 18.

Further, in another exemplary embodiment of the invention, shield plane 20 should be sufficiently close to field termination ring 18 so that the electric field between component 14 and shield plane 20 dominates. The height of the solder bumps 22 may be configured to provide the preferable maximum distance between field termination ring 18 and shield plane 20. For example, a 1000V MOSFET intended to operate at 80% rated voltage at 125° C. should have shield plane 20 within 50 to 200 $\mu$m from the field termination ring 18. The minimum distance between shield plane 20 and component 14 is determined by the dielectric strength of the insulating layers between shield plane 20 and component 14, such as, for example, underfill material 28 and solder mask layer 26.

Figure 2:
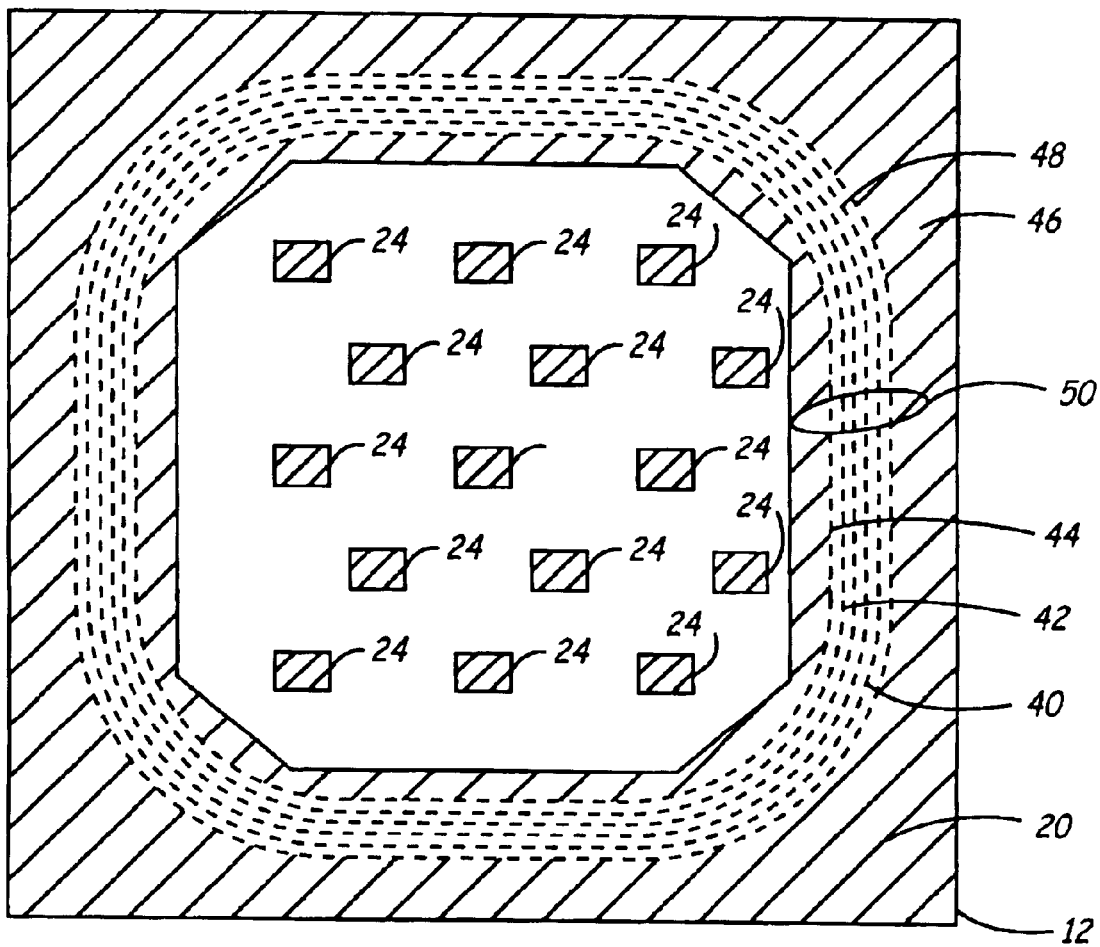
FIG. 2. is a top view of shield plane formed on a substrate with phantom termination rings superimposed thereon.

Moreover, in another exemplary embodiment of the invention, shield plane 20 has a surface area that is at least the size of the surface area of field termination ring 18. Alternatively, if there is a plurality of concentric termination rings, shield plane 20 may have a surface area of the total annular ring comprising the concentric termination rings. In addition, the surface area of shield plane 20 is coextensive with the surface area of field termination ring 18. In a preferred embodiment of the invention, the surface area of shield plane 20 is coextensive with and extends beyond the surface area of field termination ring 18 to compensation for any misalignment of component 14 when it is mounted on substrate 12. Referring to FIG. 2, a plurality of concentric field termination rings 40, 42, 44 forming a total annular ring 50 are illustrated in phantom overlying substrate 12. Shield plane 20 overlies substrate 12. The surface area 46 of shield plane 20 (shown with diagonal lines) is at least the size of the surface area 48 of total annular ring 50 comprising termination rings 40, 42, 44. Further, as illustrated in FIG. 2, surface area 46 of shield plane 20 is coextensive with the surface area 48 of the total annular ring of the field termination rings and also extends beyond surface area 48. As used herein, "coextensive" means that the boundaries or edges of the surface area of the field termination ring, or the total annular ring, align with the boundaries of the surface area of the shield plane or that the boundaries of the surface area of the shield plane extend beyond the boundaries of the field termination ring (or total annular ring, as the case may be).

Referring again to FIG. 1, in another exemplary embodiment of the invention, flip-chip component package 10 may further comprise a circuit trace 30 formed within substrate 12. Without shield plane 20, if trace 30 has a strong potential and is in close proximity to surface 16 of component 14, an inversion layer may form in component 14 due to the creation of a parasitic transistor between component 14 and substrate 12. Shield plane 20 serves to terminate or reduce the effect of the electric fields created at circuit trace 30 so that it cannot detrimentally influence the performance of component 14. Accordingly, it will be appreciated by those skilled in the art that shield plane 20 may be formed overlying substrate 12 or, alternatively, may be formed within substrate 12 as long as it is interposed between circuit trace 30 and component 14.

Figure 3:
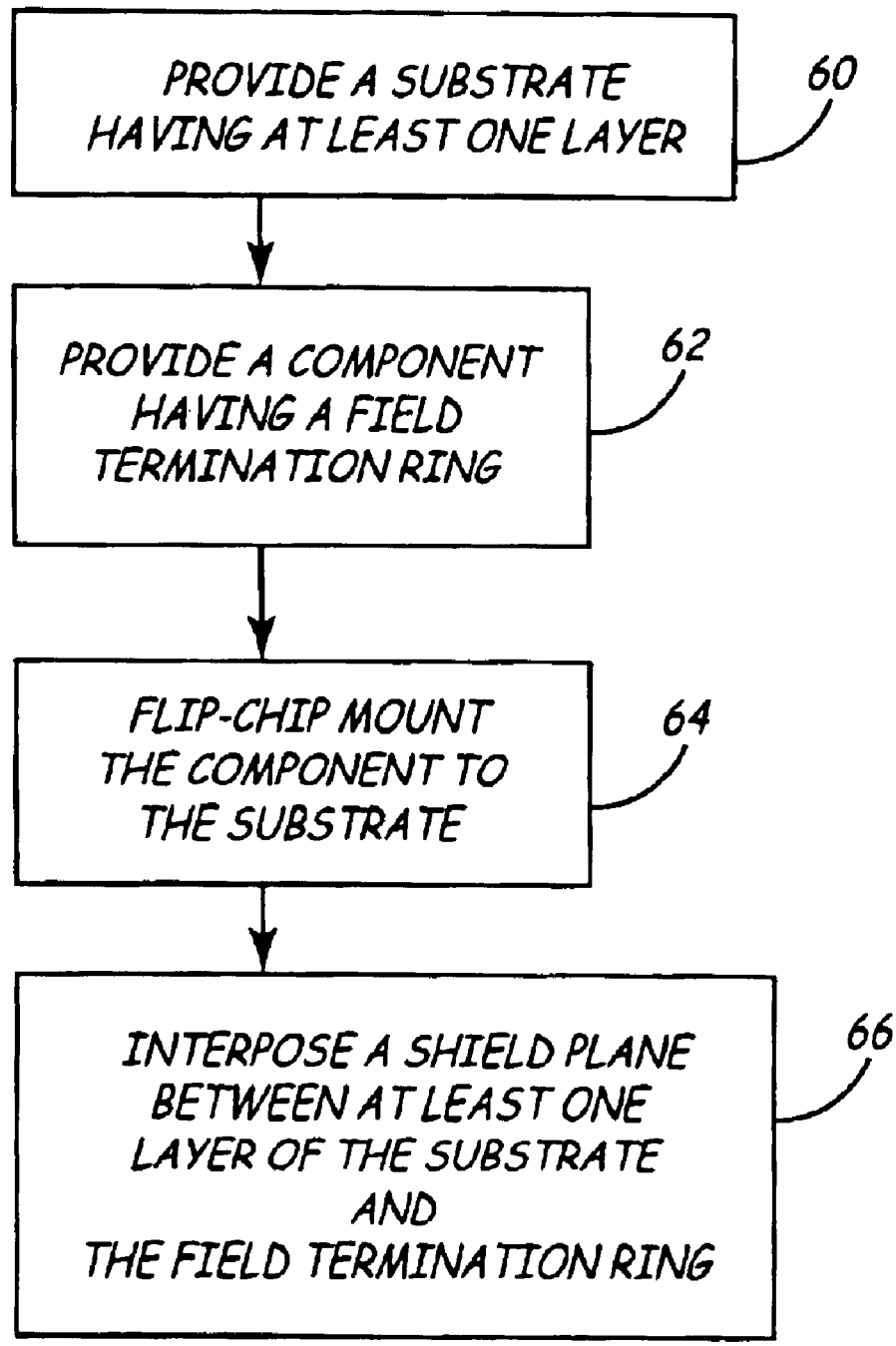
FIG. 3 is a flow chart of a flip-chip packaging process in accordance with an exemplary embodiment of the present invention.

FIG. 3 illustrates a flip-chip package process in accordance with another exemplary embodiment of the invention. A non-metal substrate is provided at step 60. It will be appreciated that the substrate may comprise one layer or a plurality of various layers, one or more of which may be a circuit trace. In one embodiment of the invention, a plurality of solder bonding pads is formed on a surface of the substrate. The solder bonding pads can be either SMD (Solder Mask Defined) type or NSMD (Non-SMD) type, or mixed SMD-NSMD type. These types of bond pads are all well-known in the semiconductor industry, so description thereof will not be further detailed.

A component having a field termination ring is provided at step 62. A plurality of solder bumps is formed on a surface of the component. The component then is flip-chip mounted onto the substrate, as provided at step 64. The component is mounted in an upside-down (flip chip) manner onto the substrate, with the solder bumps thereof being aligned respectively to the substrate-side bonding pads. A solder-reflow process is then performed to reflow the solder bumps over the substrate-side bonding pads. In an optional step, an underfill material then may be provided, which flows by capillary action into the gap between the component and the substrate.

The flip-chip packaging process of the present invention further comprises interposing a shield plane between the at least one layer of the substrate and the field termination ring of the component, as provided at step 66. In one exemplary embodiment of the invention, the shield plane may overlie the substrate. In this embodiment, the shield plane is disposed on the surface of the substrate before the component is flip-chip mounted onto the substrate. In another exemplary embodiment of the invention, the shield plane may be formed within the substrate as the substrate is formed and may be interposed between the field termination ring and a circuit trace formed as a layer of the substrate. In this embodiment, the shield plane is interposed between the field termination ring and the circuit trace before the component is flip-chip mounted onto the substrate.

Thus, there has been provided, in accordance with the invention, a flip-chip package and a flip-chip packaging process that fully meets the needs set forth above. The package is compact and provides stable electrical characteristics, even at high temperatures. Although various embodiments of the invention have been described and illustrated with reference to specific embodiments thereof, it is not intended that the invention be limited to such illustrative embodiments. For example, while the invention has been described for use with high voltage components, it will be appreciated that the invention may be used with any suitable electronic component. Further, while the field termination ring is described has having the shape of a "ring", it will be appreciated that the field termination ring and any corresponding "total annular ring," as used herein, may assume any shape that surrounds an internal active region. Moreover, while the present invention has been described with reference to operation of high voltage components at temperatures above about 80° C., the invention may be useful at temperatures below 80° C. Those of skill in the art will recognize that many variations and modifications of such embodiments are possible without departing from the spirit of the invention. Accordingly, it is intended to encompass within the invention all such modifications and variations as fall within the scope of the appended claims.

Benefits, other inventive aspects, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A flip-chip package comprising:
   a substrate having at least one layer;
   a component flip-chip mounted to said substrate, said component having a field termination ring; and
   a shield plane interposed between said at least one layer of said substrate and said field termination ring.

2. The flip-chip package of claim 1, wherein said shield plane is configured to receive a biasing voltage that produces a dominant electric field between said component and said shield plane.

3. The flip-chip package of claim 2, further comprising an underfill disposed between said component end said shield plane, wherein said dominant electric field between said component and said shield plane substantially migrates ions in said underfill towards said shield plane.

4. The flip-chip package of claim 2, further comprising an underfill disposed between said component and said shield plane, wherein said dominant electric field between said component and said shield plane creates polarization in said underfill towards said shield plane.

5. The flip-chip package of claim 1, wherein said component is configured to receive a first positive biasing voltage having a first magnitude end said shield piano is configured to receive a second positive biasing voltage having a second magnitude at least as great said first magnitude.

6. The flip-chip package of claim 1, wherein said component is configured to receive a first negative biasing voltage having a first magnitude and said shield plane is configured to receive a second negative biasing voltage having a second magnitude at least as great as said first magnitude.

7. The flip-chip package of claim 1, wherein said shield plane is connected to a terminal of said component.

8. The flip-chip package of claim 1, wherein said field termination ring has a first surface area and said shield plane has a second surface area that is at least as great as and is coextensive with said first surface area.

9. The flip-chip package of claim 1, wherein said at least one layer is a circuit trace.

10. The flip-chip package of claim 1, wherein said shield plane overlies said substrate.

11. The flip-chip package of claim 1, wherein said component is a device selected from the group comprising a Field Effect Transistor (FET), a Metal Oxide Semiconductor (MOS) FET (MOSFET), an Insulated Gate FET (IGFET), a thyristor, a bipolar transistor, a diode, an MOS-controlled thyristor, a resistor, and a capacitor.

12. The flip-chip package of claim 1, wherein the component is operable with a potential greater than fifty (50) volts.

13. The flip-chip package of claim 1, wherein the component is operable with a potential greater than one hundred (100) volts.

14. The flip-chip package of claim 1, wherein the component is operable with a potential greater than five hundred (500) volts.

15. The flip-chip package of claim 1, wherein the component is operable with a potential greater than one thousand (1000) volts.

16. The flip-chip package of claim 1, wherein the component is operable with a potential greater than one thousand six hundred (1600) volts.

17. The flip-chip package of claim 1, wherein the shield plane comprises a metal.

18. The flip-chip package of claim 1, wherein the shield plane comprises copper.

* * * * *

UNITED STATES PATENT AND TRADEMARK OFFICE
CERTIFICATE OF CORRECTION

| | | |
|---|---|---|
| PATENT NO. | : 6,836,022 B2 | Page 1 of 1 |
| APPLICATION NO. | : 10/365765 | |
| DATED | : December 28, 2004 | |
| INVENTOR(S) | : Mark R. Boone et al. | |

It is certified that error appears in the above-identified patent and that said Letters Patent is hereby corrected as shown below:

Column 6, line 62, please delete "end said" and insert --and said--

Column 7, line 6, please delete "end said shield piano" and insert --and said shield plane--

Signed and Sealed this

Nineteenth Day of December, 2006

JON W. DUDAS
*Director of the United States Patent and Trademark Office*